United States Patent
Shih et al.

(10) Patent No.: US 8,044,638 B2
(45) Date of Patent: Oct. 25, 2011

(54) MONITORING SYSTEM FOR MONITORING LOW VOLTAGE DISCONNECTING VALUE OF SECONDARY BATTERIES AND METHOD FOR THE SAME

(75) Inventors: Wei-Hua Shih, Taipei Hsien (TW); Kuo-Sheng Chao, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 761 days.

(21) Appl. No.: 12/178,656

(22) Filed: Jul. 24, 2008

(65) Prior Publication Data

US 2009/0309549 A1    Dec. 17, 2009

(30) Foreign Application Priority Data

Jun. 13, 2008 (CN) .......................... 2008 1 0302136

(51) Int. Cl.
*H01M 10/46* (2006.01)
(52) U.S. Cl. ........................ 320/134; 320/136
(58) Field of Classification Search .................. 320/107, 320/132, 134, 136
See application file for complete search history.

(56) References Cited

U.S. PATENT DOCUMENTS 6,885,879 B1 *  4/2005  Got et al. ................. 455/572
2009/0017643 A1 *  1/2009  Oakes ...................... 439/34

* cited by examiner

*Primary Examiner* — Edward Tso
(74) *Attorney, Agent, or Firm* — Altis Law Group, Inc.

(57) ABSTRACT

A monitoring system for monitoring low voltage disconnecting value of a secondary battery includes a signal collection apparatus, an analogy-digital converter, a processor, a switch, and a controller. The signal collection is connected to a secondary battery to read voltage signals of the secondary battery at regular intervals. The analogy-digital converter is connected to the signal collection apparatus to receive the voltage signals and convert the voltage signals to digital signals. The processor is connected to the analogy-digital converter to determine whether the voltage of the secondary battery reach a low voltage disconnecting value. The switch is connected to the secondary battery to supply power to a functional unit. The controller is connected to the switch and the processor to determine status of the switch according to the determined result of the processor.

8 Claims, 2 Drawing Sheets

MONITORING SYSTEM FOR MONITORING LOW VOLTAGE DISCONNECTING VALUE OF SECONDARY BATTERIES AND METHOD FOR THE SAME

BACKGROUND

1. Field of the Invention

The present invention relates to a monitoring system for monitoring low voltage disconnecting value of a secondary battery and a method for the same.

2. Description of the Related Art

Secondary batteries do not normally tolerate deep discharges. Deep discharge of a battery may cause damages in a long term and shorten the life of the battery. When the power level of the secondary battery drops to a certain voltage value, it should stop supplying power to the corresponding components to prevent damages to the battery.

Therefore, what is needed, is a new monitoring system for preventing deep discharge of a secondary battery.

DETAILED DESCRIPTION

Figure 1:
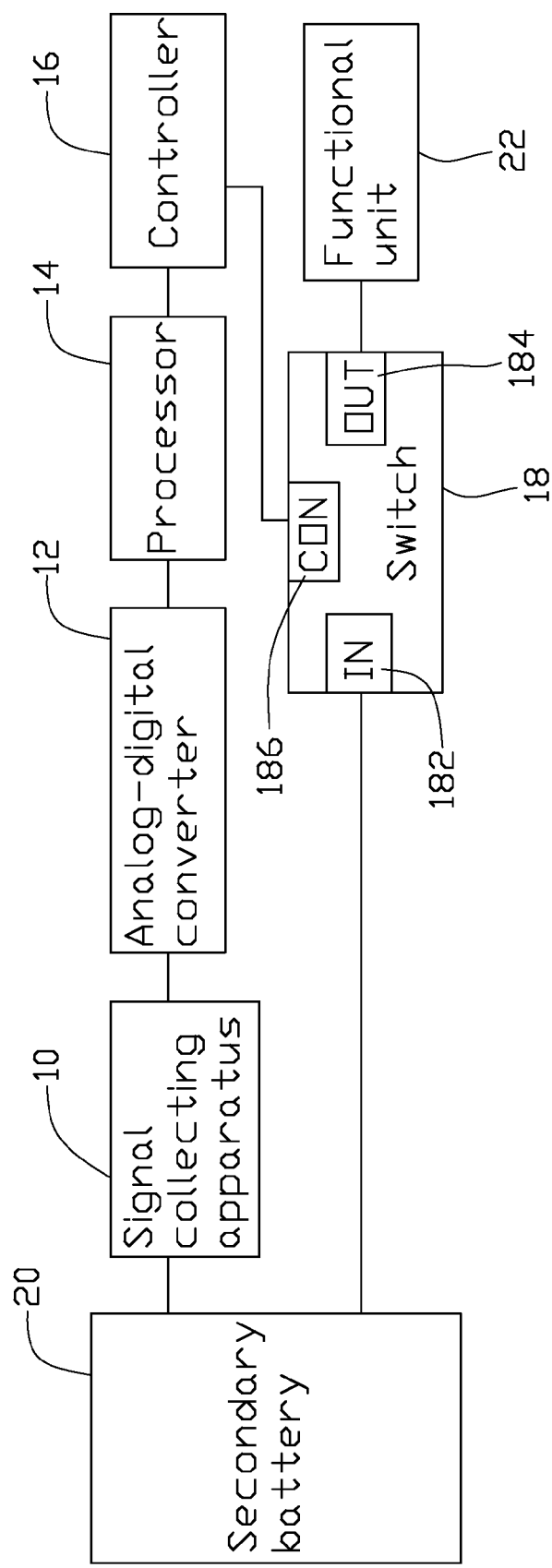
FIG. 1 is a block diagram of a monitoring system for monitoring low voltage disconnecting value of a secondary battery in accordance with a first embodiment of the present invention.

Referring to FIG. 1, a monitoring system for monitoring low voltage disconnecting value of a secondary battery in accordance with a first embodiment of the present invention includes a signal collecting apparatus 10, an analog-digital converter 12 connected to the signal collecting apparatus 10, a processor 14 connected to the analog-digital converter 12, a controller 16 connected to the processor 14, and a switch 18.

The switch 18 includes a switch input terminal 182, a switch output terminal 184, and a switch control terminal 186. A secondary battery 20 is connected to the switch control terminal 186 of the switch 18 via the signal collecting apparatus 10, the analog-digital converter 12, the processor 14, and the controller 16, in sequence. The secondary battery 20 is also connected to the switch input terminal 182 of the switch 18. The switch output terminal 184 of the switch 18 is connected to a functional unit 22.

Figure 2:
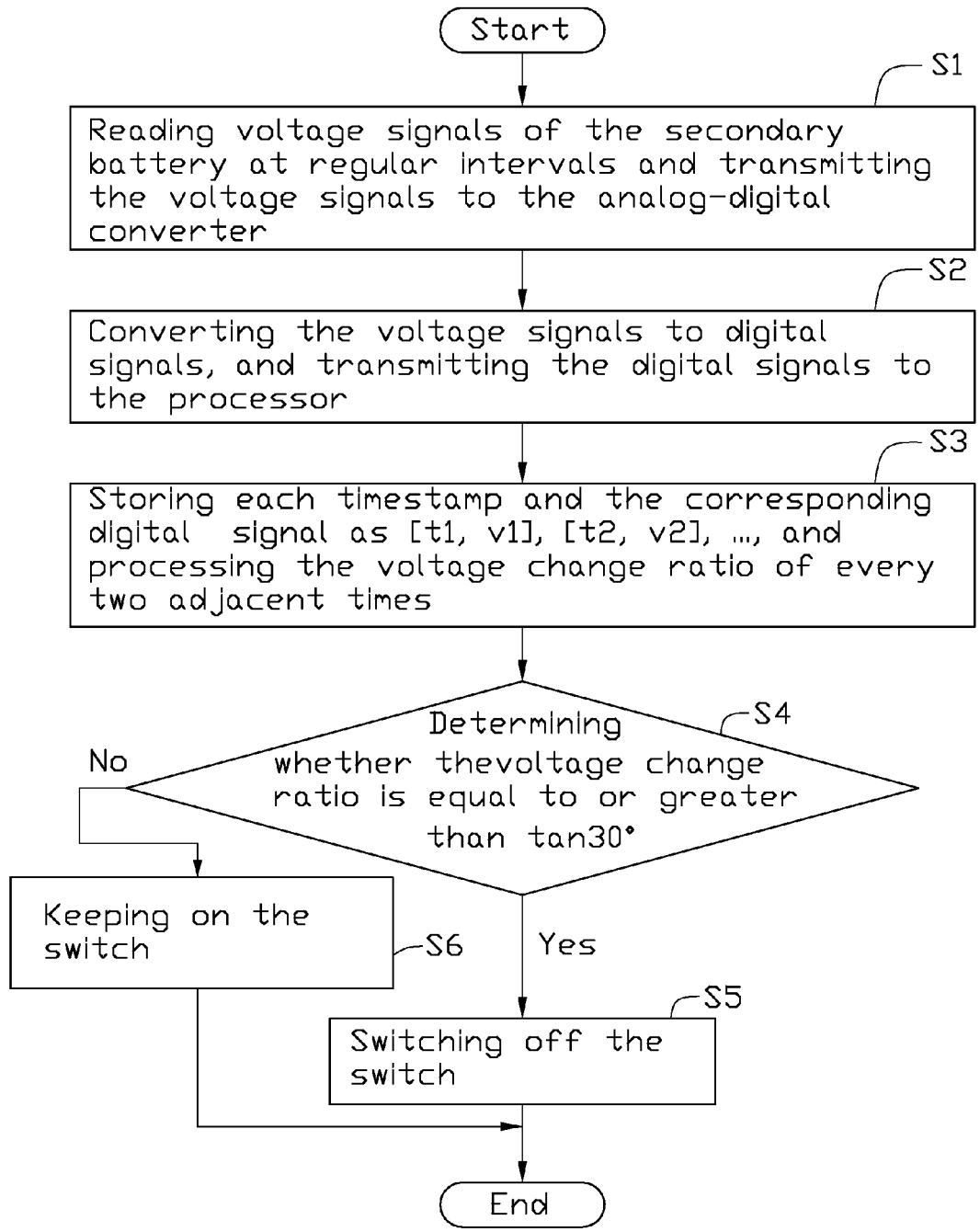
FIG. 2 is a flow chart of a monitoring method for monitoring a low voltage disconnecting value of a secondary battery in accordance with a second embodiment of the present invention.

Referring to FIG. 2, a monitoring method for monitoring a low voltage disconnecting value of a secondary battery in accordance with a second embodiment of the present invention includes:

Step S1: reading voltage signals of the secondary battery 20 at regular intervals and transmitting the signals to the analog-digital converter 12. The voltage signals are analog signals of the secondary battery 20.

Step S2: converting the analog voltage signals into digital signals, such as voltage values, and transmitting the voltage values to the processor 14.

Step S3: storing timestamp and the corresponding voltage value of each reading as [t1, v1], [t2, v2] ..., and processing the voltage change ratio of each two adjacent times, such as $|(v2-v1)/(t2-t1)|$.

Step S4: determining whether $|(v2-v1)/(t2-t1)|$ is equal to or greater than a predetermined value.

Step S5: upon the condition that $|(v2-v1)/(t2-t1)|$ is greater than or equal to the predetermined value, the processor 14 determines the secondary battery 20 should stop supplying power to the function unit 22, namely, the voltage of the secondary battery 20 has reached a low voltage disconnecting value. The controller 16 then opens the switch 18 disconnecting the battery 20 from the functional unit 22.

Step S6: upon the condition that $|(v2-v1)/(t2-t1)|$ is less than the predetermined value, the processor 14 determines that the secondary battery 20 has not reached the low voltage disconnecting value. The secondary battery 20 continues supplying power to the functional unit 22.

Various secondary batteries have various low voltage disconnecting values. When the voltages of various secondary batteries reach its low voltage disconnecting voltage, the voltage change ratio of two adjacent times of various secondary batteries is tan 30° on average. For this reason, the predetermined value is taken to be equal to tan 30° in this embodiment.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternately embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A monitoring system for monitoring low voltage disconnecting value of a secondary battery connected between a secondary battery and a functional unit, the monitoring system comprising:

a signal collecting apparatus connected to the secondary battery and capable of reading voltage signals of the secondary battery at regular intervals;

an analog-digital converter connected to the signal collecting apparatus and capable of receiving the voltage signals and converting the voltage signals into digital signals;

a processor connected to the analog-digital converter and capable of processing the digital signals and evaluating a voltage change ratio to determine whether the voltage of the secondary battery reach a low voltage disconnecting value;

a switch comprising a switch input terminal, a switch output terminal, and a switch control terminal, wherein the switch input terminal is connected to the secondary battery, the switch output terminal is connected to the functional unit, the switch being capable of connecting and disconnecting the secondary battery; and a controller connected between the switch control terminal and the processor and capable of controlling status of the switch according to the determined result of the processor.

2. The monitoring system as claimed in claim 1, wherein upon the condition that the voltage change ratio of the secondary battery is greater than or equal to a predetermined value, the processor determines the voltage of the secondary battery reaches the low voltage disconnecting value; upon the condition that the voltage change ratio of the secondary battery is less than the predetermined value, the processor determines the voltage of the secondary battery does not reach the low voltage disconnecting value.

3. The monitoring system as claimed in claim 2, wherein the voltage change ratio is equal to the absolute value of the ratio of the voltage value difference for a measuring time interval to the time interval value.

4. The monitoring system as claimed in claim 2, wherein the predetermined value is an average value at which various secondary batteries reach their low voltage disconnecting values.

5. The monitoring system as claimed in claim 4, wherein the predetermined value is equal to tan 30°.

6. A monitoring method applying the monitoring system of claim 1, comprising:
   reading voltage signals of the secondary battery at regular intervals and transmitting the voltage signals to the analog-digital converter;
   converting the voltage signals into digital signals and transmitting the digital signals to the processor;
   processing the digital signals to get the voltage change ratio, and determining whether the voltage of the secondary battery reach the low voltage disconnecting value according by comparing the voltage change ratio with a predetermined value;
   upon the condition that the voltage of the secondary battery reaches the low voltage disconnecting value, the processor controls the switch via the controller to stop the secondary battery supplying power to the functional unit; and
   upon the condition that the voltage of the secondary battery does not reach the low voltage disconnecting value, the secondary battery continues supplying power to the functional unit.

7. The monitoring method as claimed in claim 6, wherein the determining step comprises:
   using the processor to store a plurality of pairs of a timestamp and the voltage value corresponding the timestamp for evaluating the voltage change ratio of every two adjacent timestamps, the voltage change ratio being equal to the absolute value of the ratio of the voltage value difference for a measuring time interval to the time interval value.

8. The monitoring method as claimed in claim 6, wherein the predetermined value is equal to tan 30°.

* * * * *